United States Patent
Lee

(10) Patent No.: US 9,590,370 B1
(45) Date of Patent: Mar. 7, 2017

(54) CARRIER MODULE AND CONNECTOR MODULE

(71) Applicant: GIGA-BYTE TECHNOLOGY CO., LTD., New Taipei (TW)

(72) Inventor: Kyi-Lyan Lee, New Taipei (TW)

(73) Assignee: Giga-Byte Technology Co., Ltd., New Taipei (TW)

( * ) Notice: Subject to any disclaimer, the term of this patent is extended or adjusted under 35 U.S.C. 154(b) by 0 days.

(21) Appl. No.: 15/060,379

(22) Filed: Mar. 3, 2016

(30) Foreign Application Priority Data

Oct. 22, 2015 (TW) .............................. 104134633 A

(51) Int. Cl.
*H01R 13/64* (2006.01)
*H01R 25/14* (2006.01)

(52) U.S. Cl.
CPC ................................. *H01R 25/142* (2013.01)

(58) Field of Classification Search
CPC .. H01R 25/142; H01R 13/64; H01R 13/6315; H05K 7/00
USPC ....... 439/121, 137, 559, 567, 572, 573, 587, 439/588, 247, 248, 251; 361/714
See application file for complete search history.

(56) References Cited

U.S. PATENT DOCUMENTS

| | | | | |
|---|---|---|---|---|
| 5,317,105 A * | 5/1994 | Weber | ................ | H01R 13/6584 174/355 |
| 6,390,320 B2 * | 5/2002 | Hurst | .................... | B65D 81/24 215/6 |
| 7,581,972 B2 * | 9/2009 | Daamen | ............. | H01R 13/6315 439/249 |
| 7,744,172 B2 * | 6/2010 | Chen | ....................... | G06F 1/183 312/223.2 |
| 8,403,687 B2 * | 3/2013 | Abe | .......................... | B41J 2/32 439/133 |
| 8,911,250 B2 * | 12/2014 | Ehlen | ................. | H01R 13/6315 439/248 |
| 9,331,409 B2 * | 5/2016 | Naganuma | ......... | H01R 12/7047 |
| 9,337,597 B2 * | 5/2016 | Daamen | ................. | H01R 27/02 |
| 2005/0213305 A1 * | 9/2005 | Martin | ................. | H05K 5/0091 361/714 |
| 2009/0137138 A1 | 5/2009 | Ohsumi | | |

FOREIGN PATENT DOCUMENTS

TW                M496329                2/2015

OTHER PUBLICATIONS

Taiwan Patent Office, Office Action, Patent Application Serial No. 104134633, Aug. 24, 2016, Taiwan.

* cited by examiner

*Primary Examiner* — Abdullah Riyami
*Assistant Examiner* — Harshad Patel

(57) ABSTRACT

A carrier module detachably connected to a busbar is provided, including a main body, an electronic connector, and an elastic member, wherein the elastic member includes at least one elastic portion disposed between the main body and the electronic connector. When a first force is applied on the carrier module along a first direction, the electronic connector is engaged with the busbar in a first position. When a second force is applied on the carrier module along the first direction, the electronic connector moves from the first position along a second direction to a second position relative to the main body and compresses the elastic portion.

10 Claims, 11 Drawing Sheets

CARRIER MODULE AND CONNECTOR MODULE

CROSS REFERENCE TO RELATED APPLICATIONS

This non-provisional application claims priority under 35 U.S.C. §119(a) on Patent Application No. 104134633, filed in Taiwan on Oct. 22, 2015, the entirety of which is incorporated herein by reference.

BACKGROUND OF THE INVENTION

Field of the Invention

The application relates in general to a carrier module, and in particular, to a carrier module having a movable electronic connector.

Description of the Related Art

A data center is a facility to house computer systems and associated components, such as telecommunications and storage systems. It generally includes power supplies, data storage devices, environmental control devices (for example, the air conditioning or fire suppression) and various security devices.

A plurality of racks and a plurality of carrier modules are usually used in the power supplies and data storage devices. The carrier module can connect to a busbar of the rack for supplying electric energy or transmitting signal. However, when the carrier module has large dimensions, it usually cannot be disposed and fixed on the rack due to production errors.

BRIEF SUMMARY OF INVENTION

To address the deficiencies of conventional products, an embodiment of the invention provides a carrier module detachably connected to a busbar, including a main body, an electronic connector, and an elastic member, wherein the elastic member includes at least one elastic portion disposed between the main body and the electronic connector. When a first force is applied on the carrier module along a first direction, the electronic connector is engaged with the busbar in a first position. When a second force is applied on the carrier module along the first direction, the electronic connector moves from the first position along a second direction to a second position relative to the main body and compresses the elastic portion.

In some embodiments, the second force exceeds the first force.

In some embodiments, the distance between the second position and the main body is less than the distance between the first position and the main body.

In some embodiments, the second direction is opposite from the first direction.

In some embodiments, the elastic member is fixed on the main body.

In some embodiments, the elastic member is fixed on the electronic connector.

In some embodiments, when the electronic connector is in the second position, the electronic connector is attached on a lateral surface of the main body.

In some embodiments, the main body comprises a box having a lateral surface and a cover joined to the box, wherein when the cover moves toward the lateral surface relative to the box, the cover is separated from the box, wherein the elastic member further comprises a stopping portion movably disposed between the cover and the lateral surface.

In some embodiments, the elastic member comprises a metal sheet.

BRIEF DESCRIPTION OF DRAWINGS

The invention can be more fully understood by reading the subsequent detailed description and examples with references made to the accompanying drawings, wherein.

DETAILED DESCRIPTION OF INVENTION

The making and using of the embodiments of the carrier module are discussed in detail below. It should be appreciated, however, that the embodiments provide many applicable inventive concepts that can be embodied in a wide variety of specific contexts. The specific embodiments discussed are merely illustrative of specific ways to make and use the embodiments, and do not limit the scope of the disclosure.

Unless defined otherwise, all technical and scientific terms used herein have the same meaning as commonly understood to one of ordinary skill in the art to which this invention belongs. It should be appreciated that each term, which is defined in a commonly used dictionary, should be interpreted as having a meaning conforming to the relative skills and the background or the context of the present disclosure, and should not be interpreted by an idealized or overly formal manner unless defined otherwise.

Figure 1:
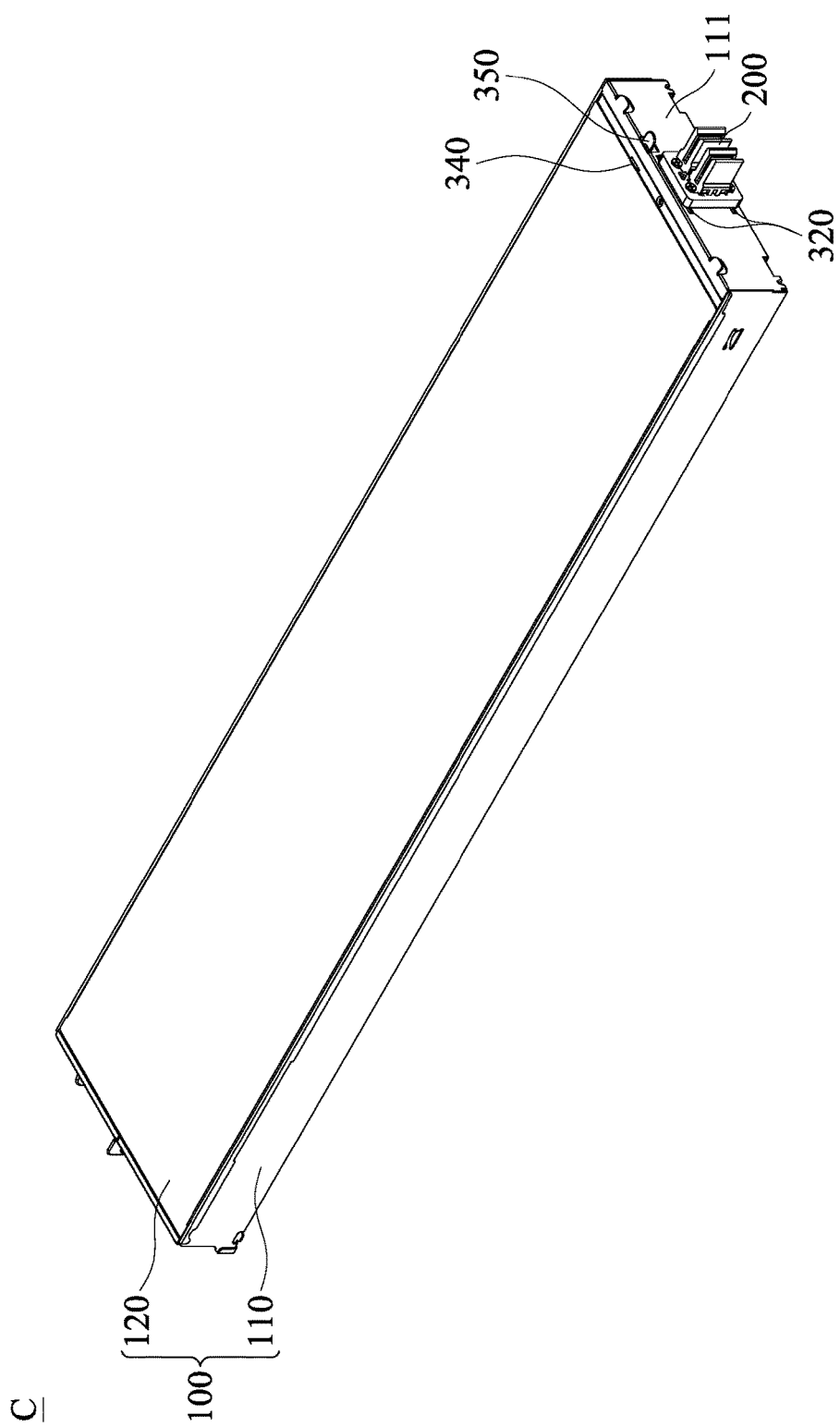
FIG. 1 is a schematic diagram of a carrier module according to an embodiment of the invention.
Figure 2:
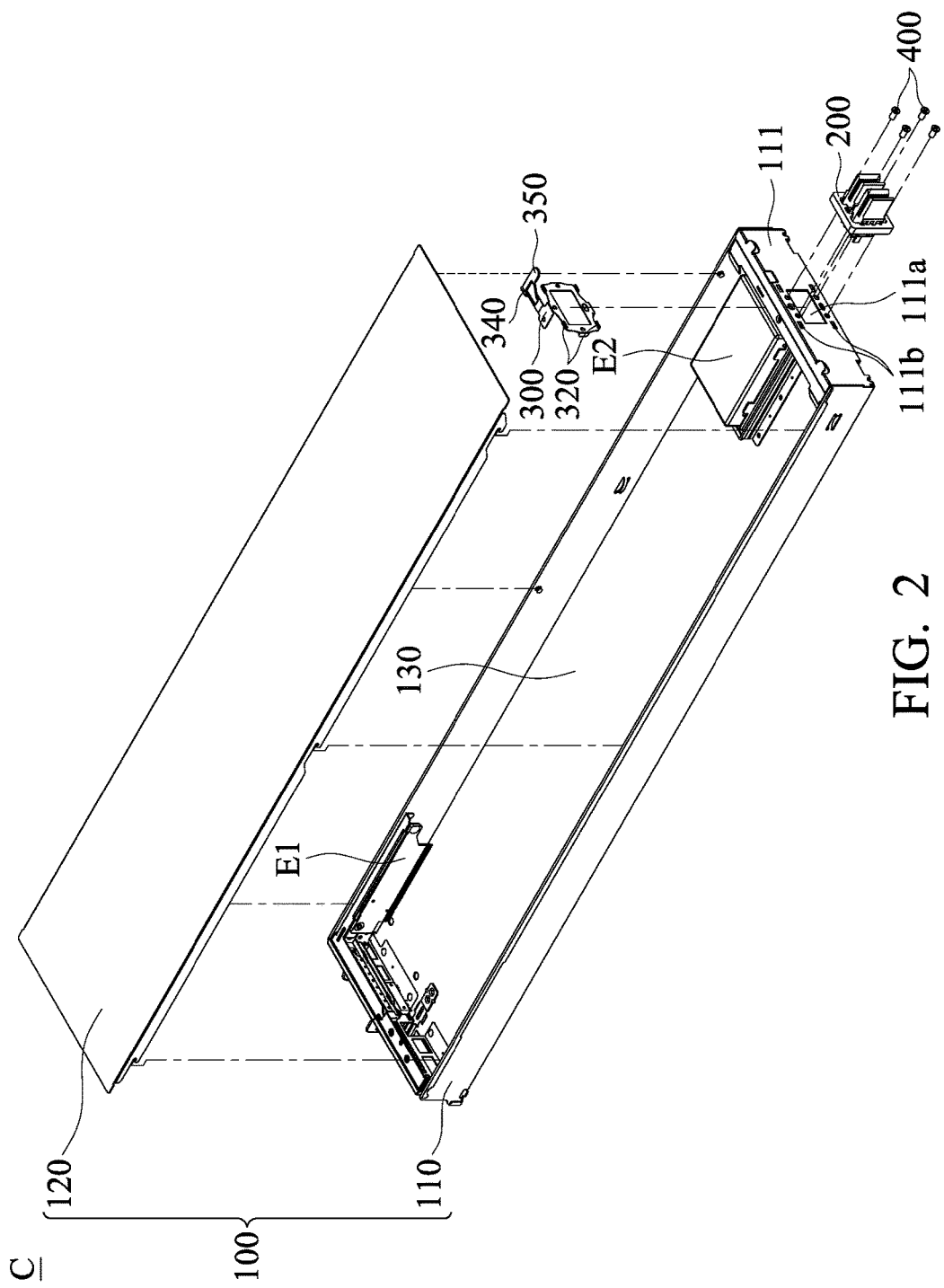
FIG. 2 is an exploded-view diagram of the carrier module in FIG. 1.

First, referring to FIGS. 1 and 2, a carrier module C in an embodiment of the invention primarily comprises a main body 100, an electronic connector 200, and an elastic member 300. The main body 100 comprises a box 110 and a cover 120, wherein an accommodating space 130 is formed therebetween. Therefore, different kinds of electronic members can be accommodated and carried in the accommodating space 130, such as a circuit board E1 or a hard disk E2. The electronic connector 200 and the elastic device 300 form a connector module.

Figure 3:
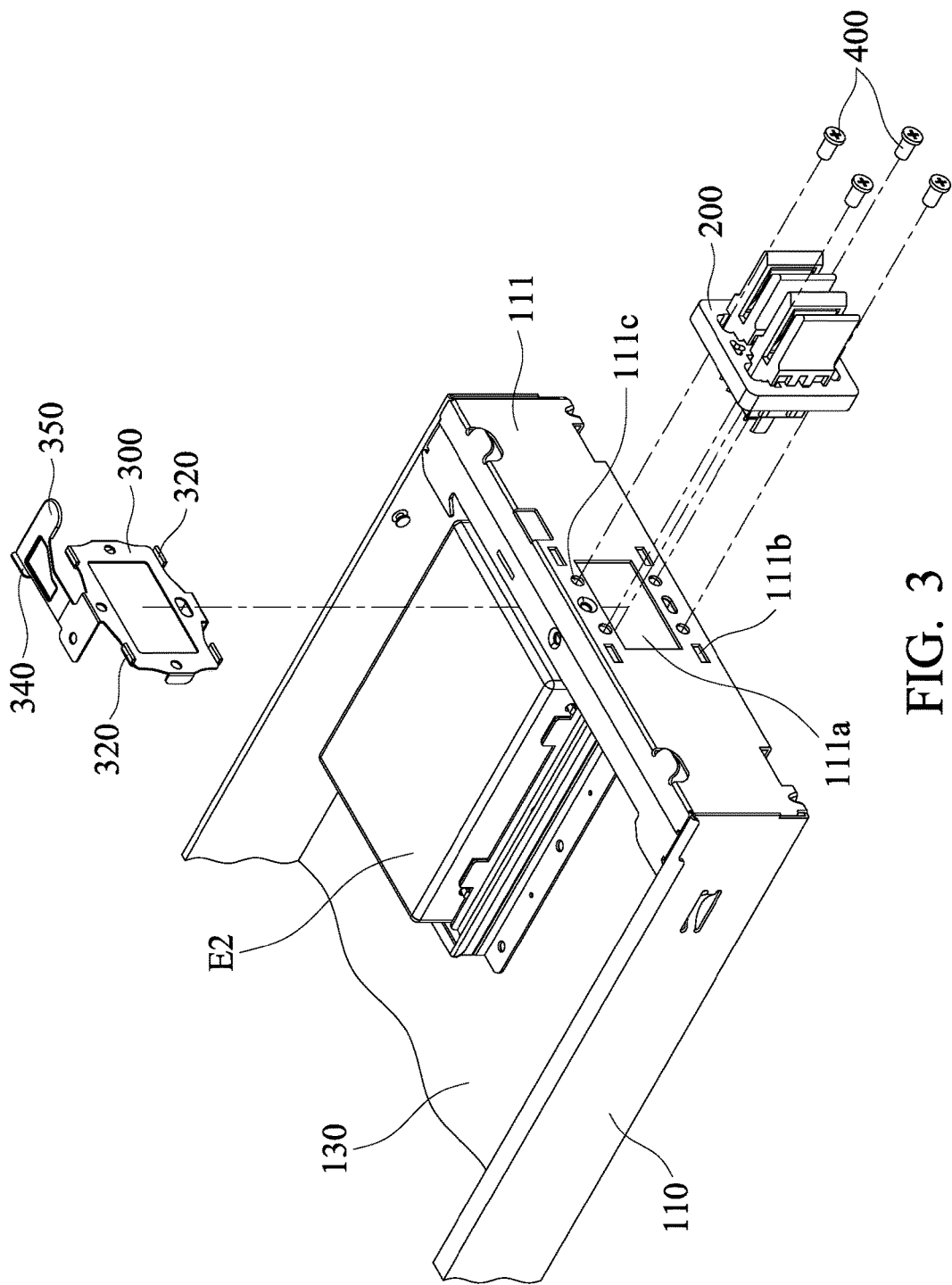
FIG. 3 is an enlarged partial exploded-view diagram of the carrier module in FIG. 2.

As shown in FIG. 3, an opening 111a, four holes 111b, and four perforations 111c are formed on a lateral surface 111 of the box 110. The holes 111b are respectively situated on four corners of the opening 111a, and the distances between the adjacent holes 111b are substantially the same. Connecting members 400 (such as a screw or a rivet) can pass through the perforations 111c, such that the electronic connector 200 can be disposed on the lateral surface 111. The position of the electronic connector 200 corresponds to the opening 111a, therefore, a plurality of wires (not shown) can pass through the opening 111a and electrically connect the electronic connector 200 with the electronic members E1 and E2 in the accommodating space 130.

Figure 4:
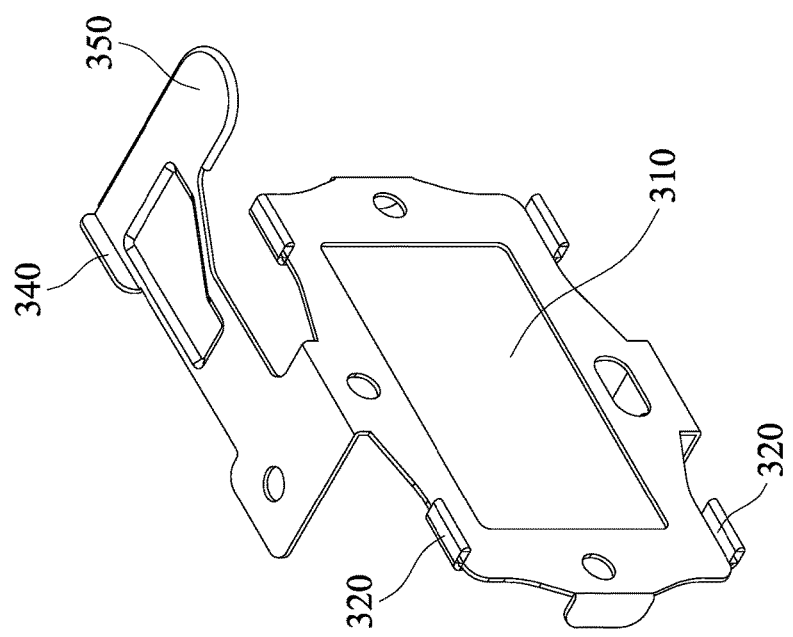
FIG. 4 is a schematic diagram of an elastic member according to an embodiment of the invention.
Figure 5:
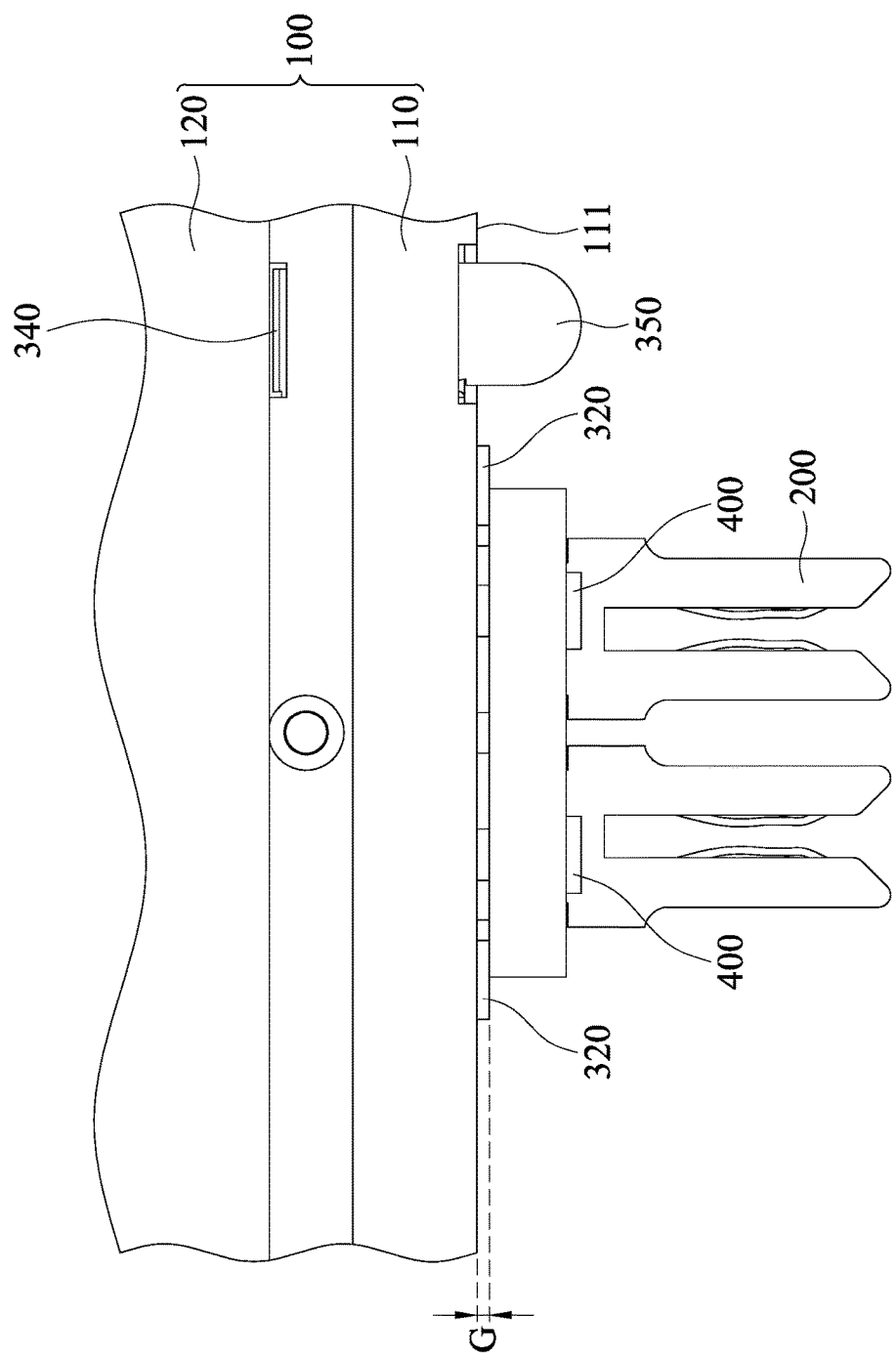
FIG. 5 is an enlarged partial top view of the carrier module in FIG. 1.

Referring to FIGS. 3-5, in this embodiment, the elastic member 300 is fixed in the box 110, and has an opening 310, four elastic portions 320, a stopping portion 340, and a connecting portion 350. The dimensions of the opening 310 are substantially the same as that of the opening 111a. The elastic portions 320 are respectively situated on four corners of the opening 310, and have the appearance similar to the holes 111b. The dimensions of the elastic portion 320 are less than that of the hole 111b. Thus, when the elastic member 300 is disposed in the main body 100, the elastic portions 320 pass through the holes 111b and protrude from the lateral surface 111 of the box 110, and a gap G is formed between the elastic connector 320 and the main body 100 (FIG. 5). Furthermore, when the elastic member 300 is fixed on the box 110, the opening 310 corresponds to the opening 111a, such that the configuration of the wires is not obstructed. In this embodiment, the gap G is between 0.5 mm-3 mm, such as 1 mm. The elastic member 300 is a metal sheet, for example.

Figure 6:
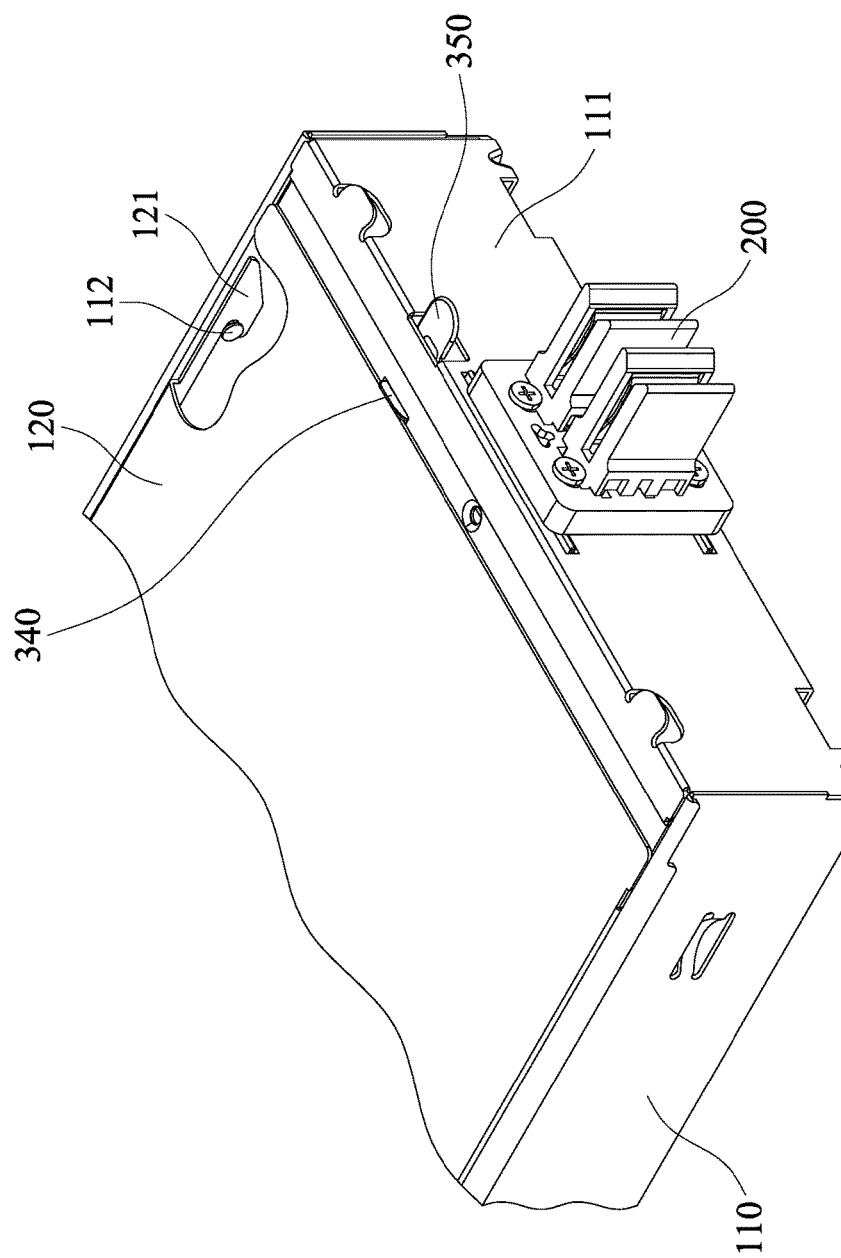
FIG. 6 is an enlarged partial schematic diagram of the carrier module in FIG. 1, wherein partial housing of the cover is omitted.

Referring to FIGS. 3-5, the connecting portion 350 of the elastic member 300 connects the stopping portion 340 and protrudes from the lateral surface 111. The stopping portion 340 is movably disposed in a third position between the box 110 and the lateral surface 111. It should be noted that, as shown in FIG. 6, a plurality of protrusions 112 and a plurality of hook-shaped structures 121 are respectively formed on the box 100 and the cover 120, such that the cover 120 can be merely separated from the box 110 by sliding toward the lateral surface 111. When the stopping portion 340 is disposed between the cover 120 and the lateral surface 111, the cover 120 cannot slide toward the lateral surface 111 due to the block of the stopping portion 340. Thus, the cover 120 can be stably joined with the box 110 without additional locking member. When the user wants to replace or maintain the electronic members E1 and E2 in the accommodating space 130, he can press the connecting portion 350, and the stopping portion 340 leaves the third position between the cover 120 and the lateral surface 111. Subsequently, the cover 120 can slide toward the lateral surface 11 and be separated from the box 110.

Figure 7:
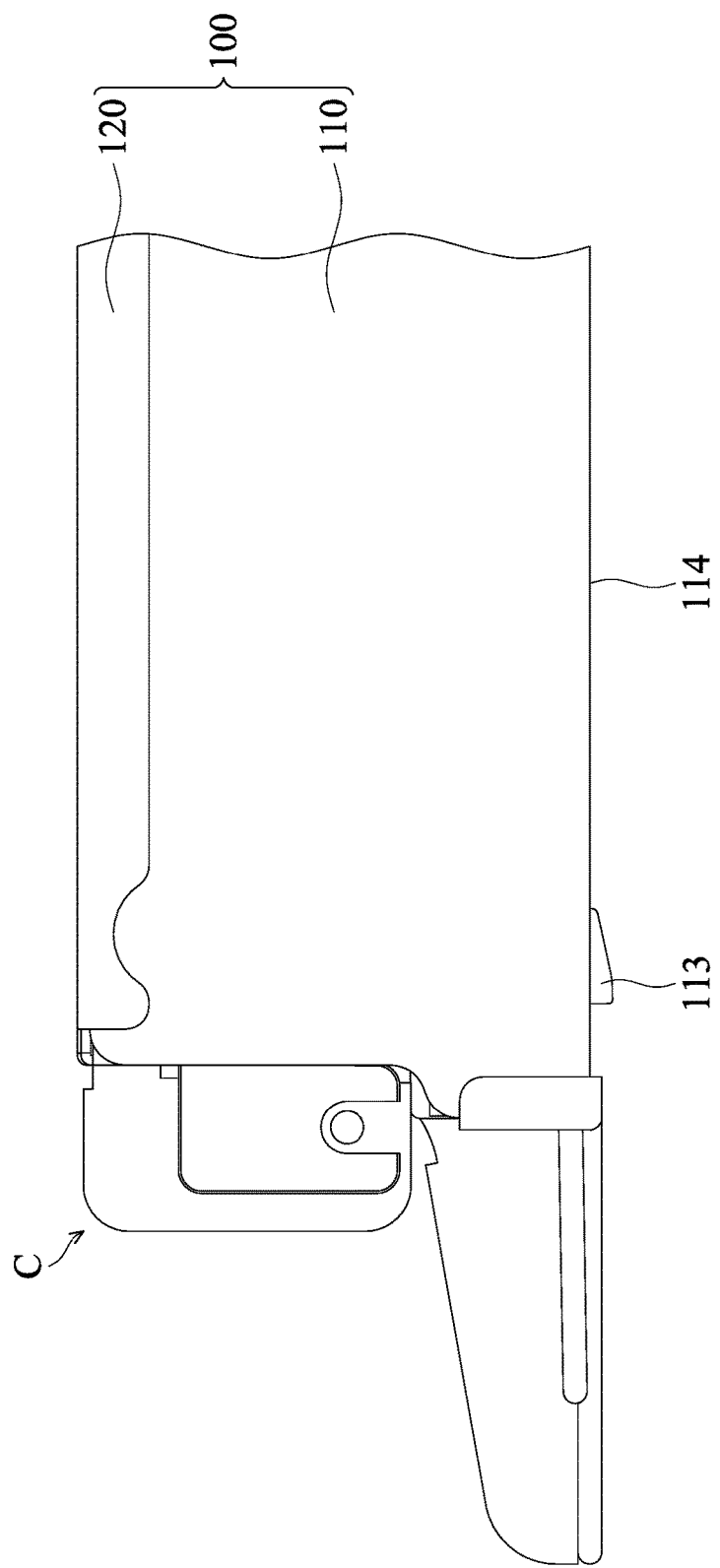
FIG. 7 is an enlarged partial side view of the carrier module in FIG. 1.
Figure 8:
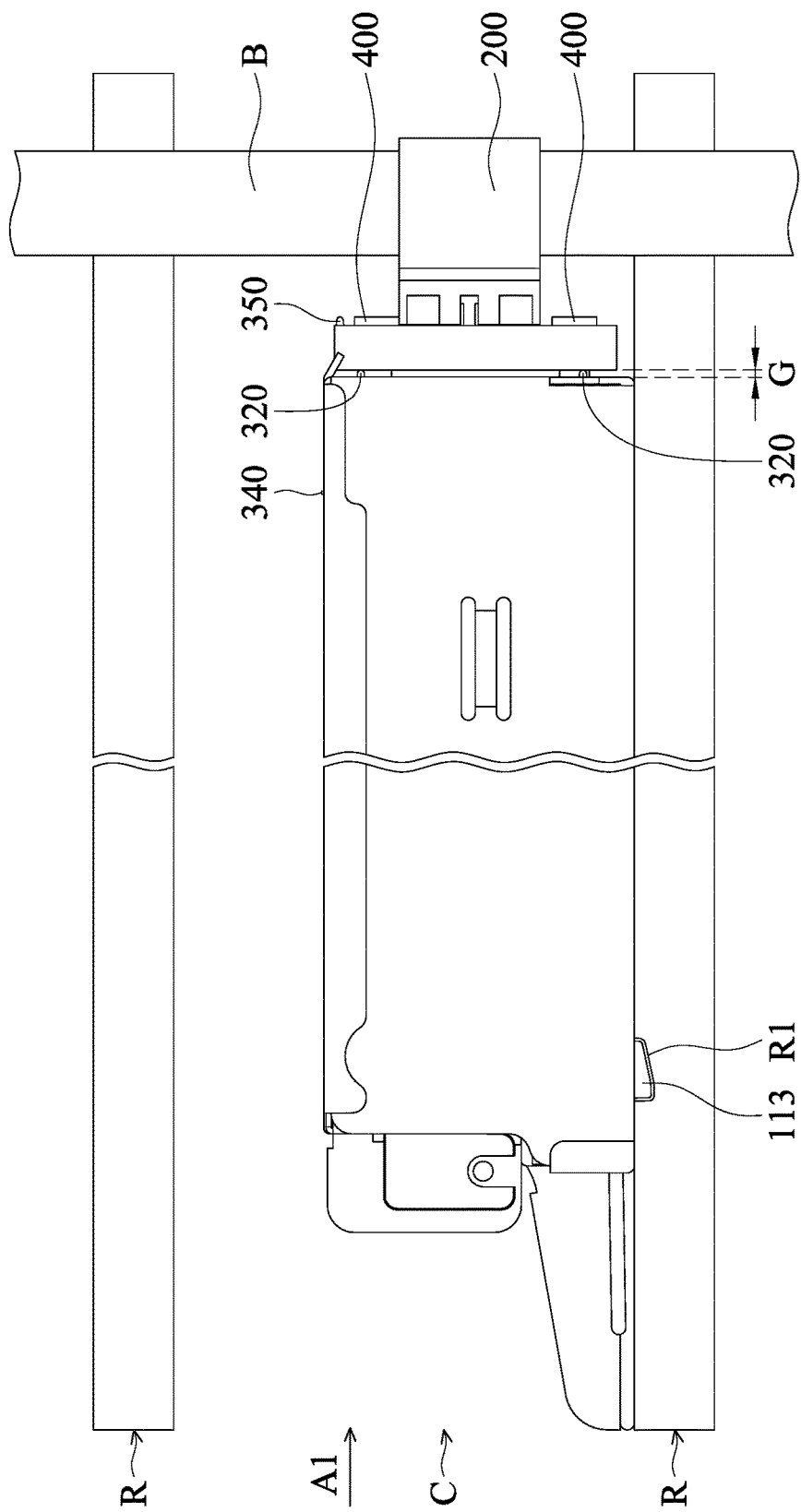
FIG. 8 is a schematic diagram of a carrier module disposed in a rack according to an embodiment of the invention.
Figure 10:
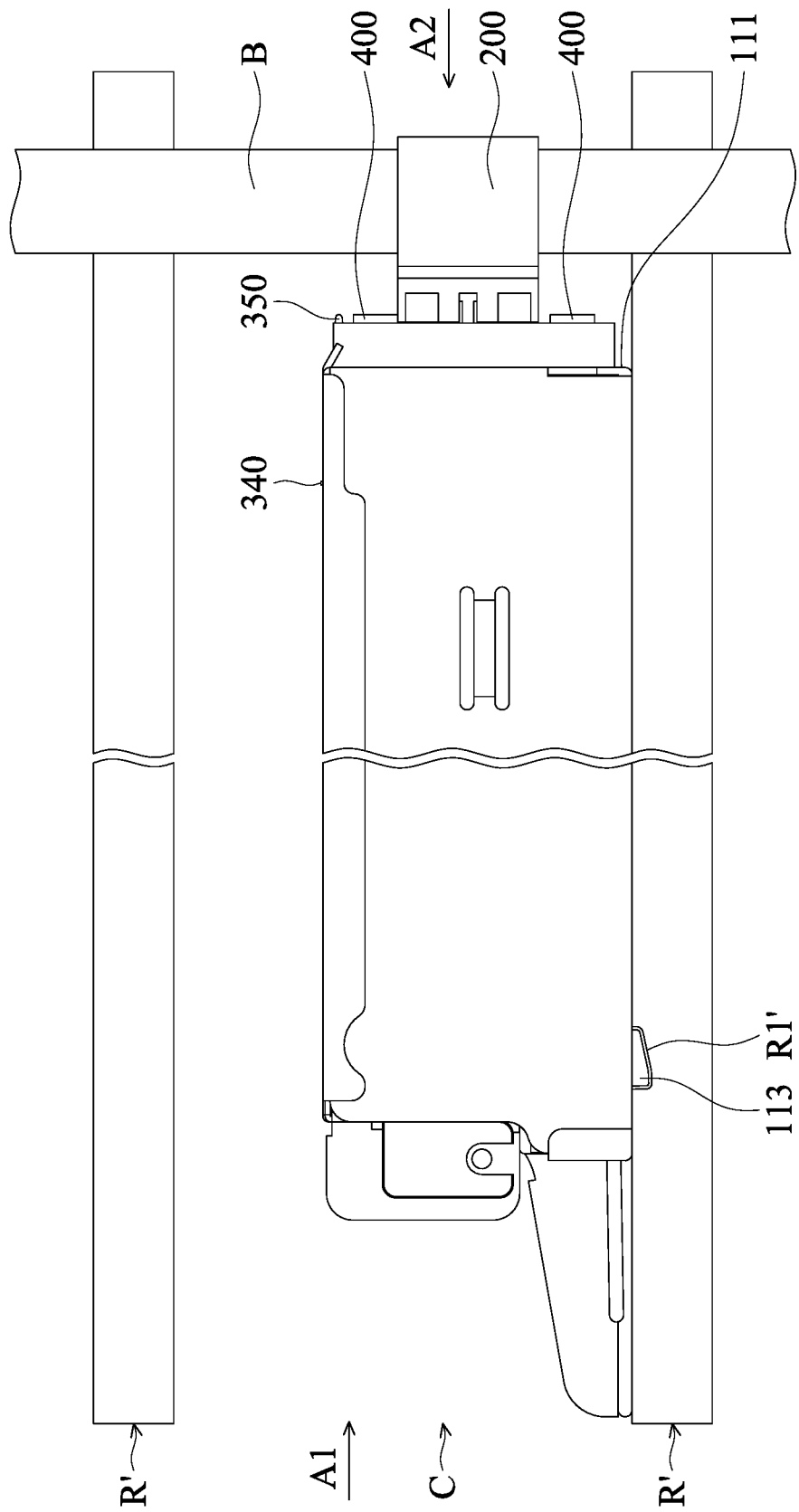

Moreover, referring to FIG. 7, in this embodiment, at least one protruding member 113 is formed on the bottom surface 114 of the box 110 for fixing the carrier module C on a rack R (FIGS. 8 and 10).

Referring to FIG. 8, when the user wants to supply electric energy or transmit signals to the carrier module C by the electronic connector 20, a first force can be provided on the carrier module C along a first direction A1. The carrier module C moves into the rack R, and the electronic connector 200 connects a busbar B on the rack R. When the dimensions of the carrier module C and the position of the protruding member 113 match the rack R, the electronic connector 200 can connect the busbar B in a position having the gap G apart from the main body 100 (a first position), and the protruding member 113 can enter a recess R1 of the rack for fixing the carrier module C.

Figure 9:
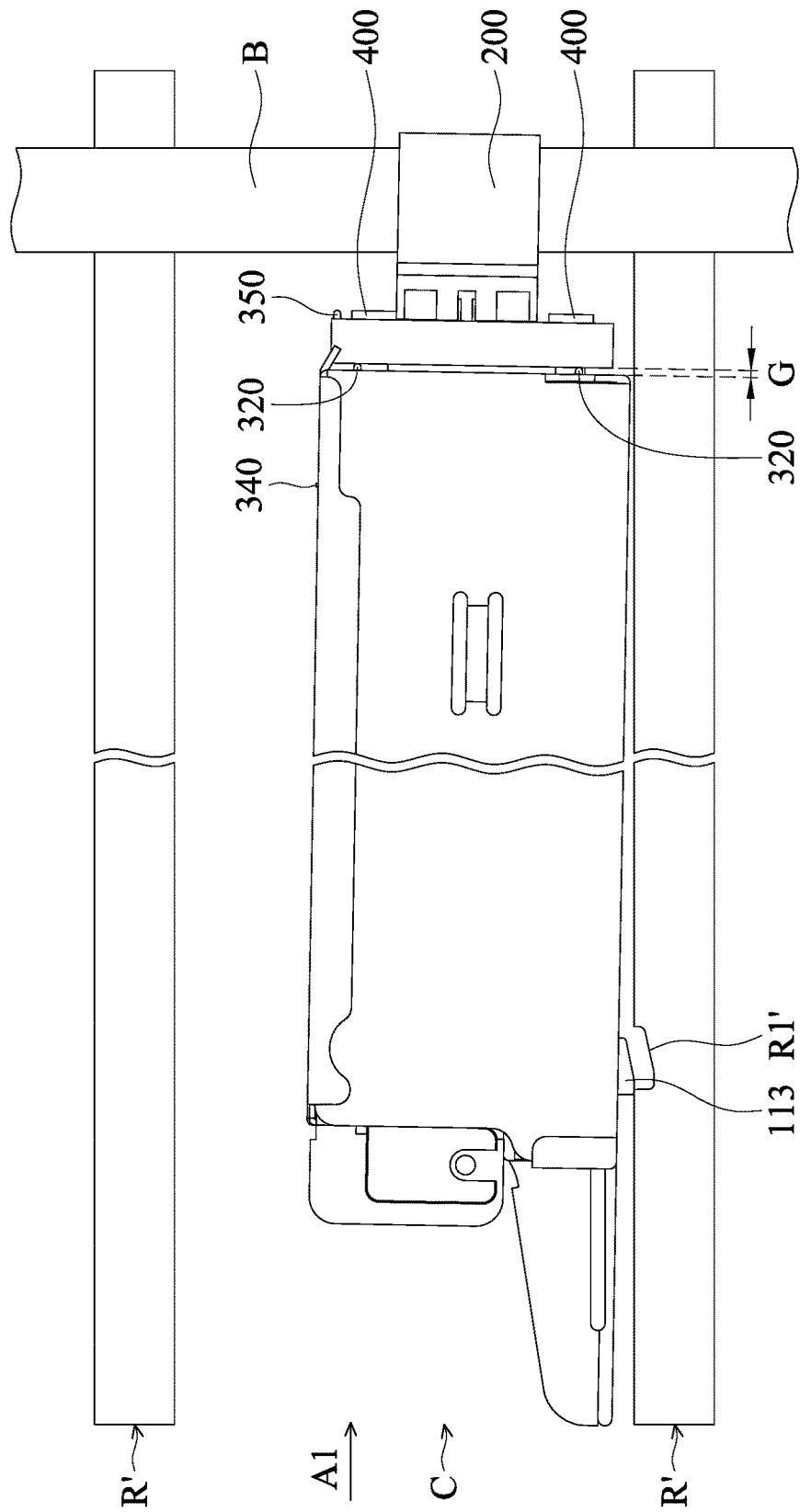
FIGS. 9 and 10 are a schematic diagram of a carrier module disposed in a rack according to another embodiment of the invention.

As shown in FIG. 9, when the dimensions of the carrier module C and the position of the protruding member 113 do not match a rack R', which means the carrier module C or the rack R' has some production errors, the first force can be still provided on the carrier module C along the first direction A1. The carrier module C moves into the rack R', and the electronic connector 200 connects a busbar B of the rack R'. However, the protruding member 113 cannot enter a recess R1' while the electronic connector 200 connects the busbar B. At this time, a second force can be provided on the carrier module C along the first direction A1, wherein the second force exceeds the first force. When the carrier module C is pushed by the second force, the electronic connector 200 moves from the first position along a second direction A2 (opposite from the first direction A1) to a second position relative to the main body 100, and compresses the elastic portions 320 of the elastic member 300. In other words, the main body 100 of the carrier module C can move along the first direction A1 some distance, and the protruding member 113 can enter the recess R1' for fixing the carrier module C.

When the user wants to maintain or replace the electronic members E1 and E2 in the carrier module C and takes out the carrier module C from the rack R', the electronic connector 200 moves from the second position to the first position due to the elastic force of the elastic member 300. It should be noted that, in this embodiment, when the electronic connector 200 is in the second position, the electronic connector 200 is attached on the lateral surface 111. That is, there is no gap between the electronic connector 200 and the main body 100 (FIG. 10). In some embodiments, when the electronic connector 200 is in the second position, a gap is still formed between the electronic connector 200 and the main body 100, and the distance between the second position and the main body 100 is less than the distance between the first position and the main body 100.

Figure 11:
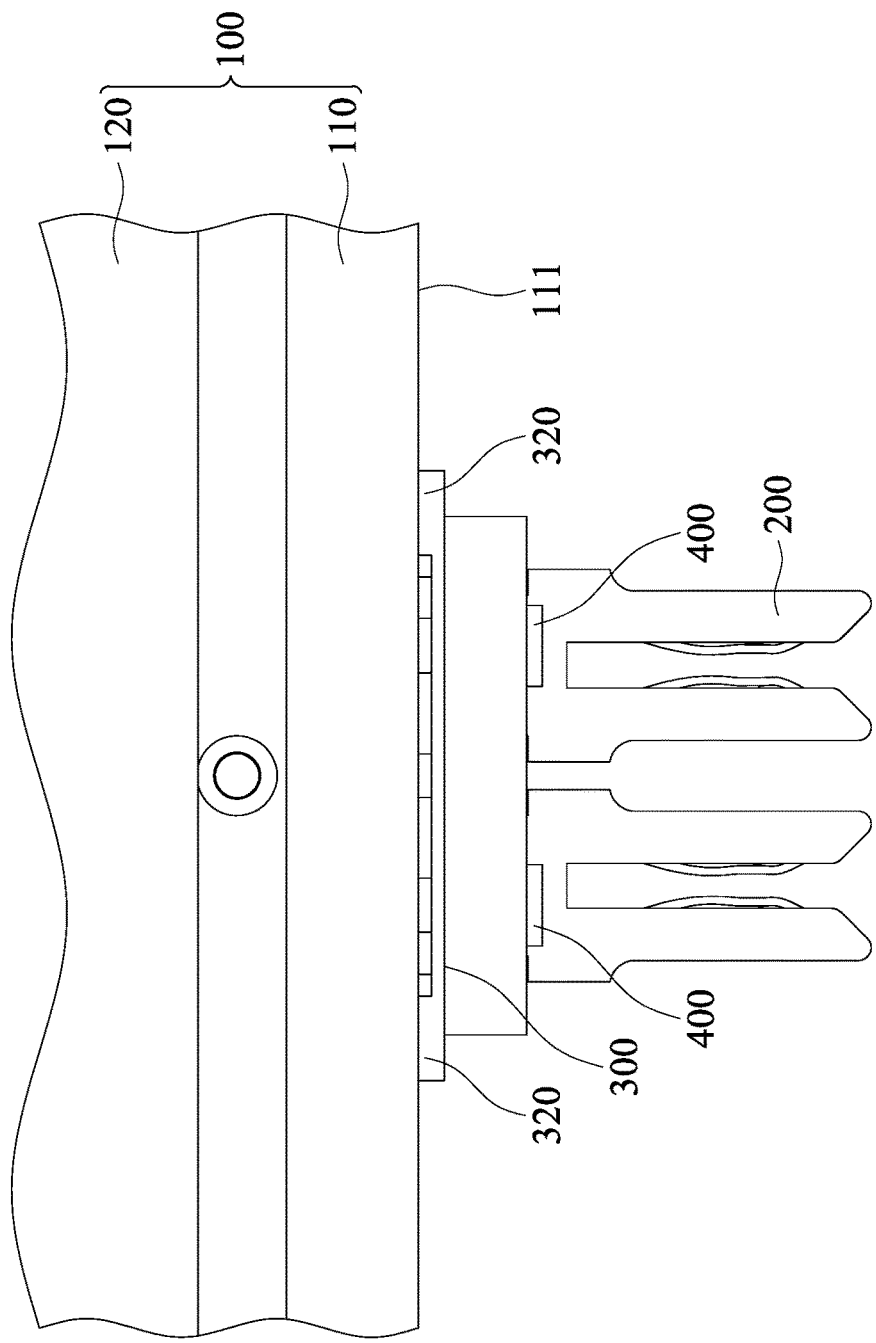
FIG. 11 is a schematic diagram of a carrier module according to another embodiment of the invention.

Referring to FIG. 11, in another embodiment of the invention, the elastic member 300 is fixed on the electronic connector 200. The elastic member 300 and the electronic connector 200 form a connector module. The holes 111b on the lateral surface 111 can be omitted. When the second force is applied on the carrier module C, the elastic portions 320 can contact the main body 100 and be compressed. In some embodiments, the electronic connector 200 can have a hollow structure, the elastic member 300 can be fixed on the electronic connector 200 and disposed in the hollow structure, and the holes 111b can be formed on the electronic connector 200 and communicated with the hollow structure. The elastic portions 320 can pass through the holes 111b, and a gap is formed between the main body 100 and the electronic connector 200.

The first force for connecting the electronic connector 200 with the busbar B can be adjusted according to the shapes and structures of the electronic connector 200 and the busbar B, and the second force for pushing the electronic connector 200 to move relative to the main body 100 can be determined according to the Young's module of the elastic portion 320. Furthermore, the number and the position of the elastic portions 320 can be adjusted as required, and are not limited to those illustrated in figures.

In summary, the carrier module is provided. The gap is formed between the main body and the electronic connector of the carrier module, and the second force for pushing the electronic connector to move relative to the main body exceeds the first force for connecting the electronic connector with the busbar. Therefore, when the dimensions of the rack match that of the carrier module, the carrier module can be joined to the rack by merely applying the first force. The applied force can be saved. When the dimensions of the rack do not match that of the carrier module, the second force can be applied, and the electronic connector moves relative to the main body and compresses the elastic portions in the gap. That is, even if a production error is formed on the recess of the rack or the protrusion of the carrier module, the carrier module can be still fixed on the rack.

Although some embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, compositions of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps. Moreover, the scope of the appended claims should be accorded the broadest interpretation so as to encompass all such modifications and similar arrangements.

While the invention has been described by way of example and in terms of preferred embodiment, it is to be understood that the invention is not limited thereto. On the contrary, it is intended to cover various modifications and similar arrangements (as would be apparent to those skilled in the art). Therefore, the scope of the appended claims should be accorded the broadest interpretation to encompass all such modifications and similar arrangements.

What is claimed is:

1. A carrier module detachably connected to a busbar, comprising:
    a main body;
    an electronic connector; and
    an elastic member, comprising at least one elastic portion disposed between the main body and the electronic connector, wherein when a first force is applied on the carrier module along a first direction, the electronic connector is engaged with the busbar in a first position, and when a second force is applied on the carrier module along the first direction, the electronic connector moves from the first position along a second direction to a second position relative to the main body and compresses the elastic portion; wherein the main body comprises a box having a lateral surface and a cover joined to the box, wherein when the cover moves toward the lateral surface relative to the box, the cover is separated from the box, wherein the elastic member further comprises a stopping portion movably disposed in a third position between the cover and the lateral surface; and the elastic member further comprises a connecting portion, connected to the stopping portion, wherein when the connecting portion is pressed, the stopping portion leaves the third position between the cover and the lateral surface.

2. The carrier module as claimed in claim 1, wherein the second force exceeds the first force.

3. The carrier module as claimed in claim 1, wherein the distance between the second position and the main body is less than the distance between the first position and the main body.

4. The carrier module as claimed in claim 1, wherein the second direction is opposite from the first direction.

5. The carrier module as claimed in claim 1, wherein the elastic member is fixed on the main body.

6. The carrier module as claimed in claim 1, wherein the elastic member is fixed on the electronic connector.

7. The carrier module as claimed in claim 1, wherein when the electronic connector is in the second position, the electronic connector is attached on a lateral surface of the main body.

8. The carrier module as claimed in claim 1, wherein the elastic member comprises a metal sheet.

9. A connector module disposed on a lateral surface of a main body of a carrier module detachably connected to a busbar, comprising:
    an electronic connector; and
    an elastic member, comprising at least one elastic portion disposed between the main body and the electronic connector, wherein a gap is formed between the electronic connector and the main body; wherein when a first force is applied on the carrier module along a first direction, the electronic connector is engaged with the busbar in a first position, and when a second force is applied on the carrier module along the first direction, the electronic connector moves from the first position along a second direction to a second position relative to the main body and compresses the elastic portion; wherein the main body comprises a box having a lateral surface and a cover joined to the box, wherein when the cover moves toward the lateral surface relative to the box, the cover is separated from the box, wherein the elastic member further comprises a stopping portion movably disposed in a third position between the cover and the lateral surface; and the elastic member further comprises a connecting portion, connected to the stopping portion, wherein when the connecting portion is pressed, the stopping portion leaves the third position between the cover and the lateral surface.

10. The connector module as claimed in claim 9, wherein the elastic member comprises a metal sheet.

* * * * *